US010823787B2

(12) United States Patent
Schat

(10) Patent No.: US 10,823,787 B2
(45) Date of Patent: Nov. 3, 2020

(54) APPARATUSES AND METHODS INVOLVING SELF-TESTING VOLTAGE REGULATION CIRCUITS

(71) Applicant: NXP B.V., Eindhoven (NL)

(72) Inventor: Jan-Peter Schat, Hamburg (DE)

(73) Assignee: NXP B.V., Eindhoven (NL)

( * ) Notice: Subject to any disclaimer, the term of this patent is extended or adjusted under 35 U.S.C. 154(b) by 259 days.

(21) Appl. No.: 16/009,836

(22) Filed: Jun. 15, 2018

(65) Prior Publication Data

US 2019/0383883 A1 Dec. 19, 2019

(51) Int. Cl.
*G01R 31/40* (2020.01)
*G01R 31/3177* (2006.01)
*G05F 1/625* (2006.01)

(52) U.S. Cl.
CPC ......... *G01R 31/40* (2013.01); *G01R 31/3177* (2013.01); *G05F 1/625* (2013.01)

(58) Field of Classification Search
CPC G01R 31/40; G01R 31/3177; G01R 31/3185; G05F 1/625; G05F 1/575; G05F 1/10; H02M 3/156; G06F 1/26
USPC .......... 324/750.3, 637–661, 500, 600, 76.11, 324/76.26, 444, 447, 515, 559, 764.01, 324/762.01, 527, 512
See application file for complete search history.

(56) References Cited

U.S. PATENT DOCUMENTS

| 8,054,057 | B2 | 11/2011 | Dash et al. |
| 9,081,063 | B2 | 7/2015 | Narayanan et al. |
| 9,151,804 | B2 | 10/2015 | Orendi et al. |
| 9,933,802 | B1 | 4/2018 | Jeong et al. |
| 2013/0127441 | A1 | 5/2013 | Tseng et al. |
| 2013/0339777 | A1* | 12/2013 | Varma ...................... G06F 1/26 713/340 |
| 2015/0377981 | A1 | 12/2015 | Orendi et al. |
| 2016/0025808 | A1* | 1/2016 | Singh ................. G01R 31/3177 714/733 |

OTHER PUBLICATIONS

Zordan, L.B., "A Built-in Scheme for Testing and Repairing Voltage Regulators of Low-Power SRAMs", 2013 IEEE 31st VLSI Test Symposium (VTS); IEEE 2013.

(Continued)

*Primary Examiner* — Vincent Q Nguyen
*Assistant Examiner* — Trung Nguyen

(57) ABSTRACT

An apparatus embodiment includes a voltage regulator circuit that provides a regulated voltage supply signal, logic state circuitry, test control circuitry, and a supply-signal monitoring circuit. The logic state circuitry includes logic modules that are reconfigured between application controlled self-test modes in which data is shifted through the logic module and while being powered from the regulated voltage supply signal. The test control circuitry operates the controlled self-test mode by causing a predetermined set of the data to shift through the logic modules and that causes the logic state circuitry to load the voltage regulator circuit by stressing the voltage regulator circuit. The supply-signal monitoring circuit monitors a quality parameter of the regulated voltage supply signal and provides an indication of characteristics of the regulated voltage supply signal which bear on a likelihood that the voltage regulator circuit is associated with defective circuitry.

22 Claims, 8 Drawing Sheets

(56) References Cited

OTHER PUBLICATIONS

C. Chen, J.H. Wu and Z. X. Wang, "150mA LDO with self-adjusting frequency compensation scheme," Electronics Letters, 23rd, vol. 47, No. 13 (Jun. 2011).
Gangopahay et. al., "A 32nm embedded fully digital phase-locked low dropout regulator for fine grained power management in digital circuits," IEEE Journal of Solid-State Circuits, vol. 49, No. 11, (Nov. 2014).
Fan Yang, Philip K. T. Mok, "Fast transient Asynchronous Digital LDO with Load Regulation Enhancement by Soft Multi Step Switching and Adaptive Timing Techniques in 65-nm CMOS," IEEE (2015).
Saad Bin Nasir, Samantak Gangopadhay, Arijit Raychowhurdy, "All-Digital Low-Dropout Regulator with adaptive Control and Reduced Dynamic Stability for Digital Circuits," IEEE Transactions on Power Electronics, vol. 31, No. 12 (Dec. 2016).
Jae Woong Jeong, Ender Yilmaz, LeRoy Winemberg, Sule Ozev, "Built in self-test for stability measurement of low dropout regulator," International Test Conference, IEEE Paper 1.4 (2017).

\* cited by examiner

APPARATUSES AND METHODS INVOLVING SELF-TESTING VOLTAGE REGULATION CIRCUITS

OVERVIEW

Aspects of various embodiments are directed to self-testing a voltage regulation circuit using varying load conditions.

Linear voltage regulator circuits are used to maintain a steady voltage. For example, the resistance of the regulator output pass device is varied in accordance with the load current, resulting in a constant voltage output. For various implementations, standards can require parameters of the voltage regulation circuit to be within various limits and/or to remain so over the life of the circuit.

These and other matters have presented challenges to self-testing voltage regulation circuit implementations, for a variety of applications.

SUMMARY

Various example embodiments are directed to issues such as those addressed above and/or others which may become apparent from the following disclosure concerning self-testing of a voltage regulator circuit by varying load conditions.

In certain example embodiments, aspects of the present disclosure involve self-testing the voltage regulation circuit over varying load conditions using a circular shift of data. The circular shift of data can allow for a self-test of the voltage regulation circuit and the connected power rail without additional hardware added to the integrated circuit.

In a more specific example embodiment, an apparatus includes a voltage regulator circuit that provides a regulated voltage supply signal as a voltage supply source for a voltage supply rail (e.g., a power rail). The apparatus further includes logic state circuitry, test control circuitry, and a supply-signal monitoring circuit. The logic state circuitry includes logic modules that are reconfigured between an application mode and a controlled self-test mode. In both modes, data is shifted through the logic modules in response to a clock signal while being powered from the regulated voltage supply signal. The test control circuitry provides the clock signal and operates the controlled self-test mode by causing a predetermined set of the data to shift through the logic modules using a scan mode. The predetermined set of data includes the contents of the flip-flows or latches which is given by the state the circuitry is in when switched to the controlled self-test mode (e.g., the original content at the start of the controlled self-test mode). The scan mode causes the logic state circuitry to load the voltage regulator circuit by stressing the voltage regulator circuit. The predetermined set of the data can cause each of the logic modules of the logic state circuitry to be exercised for the controlled self-test mode. The supply-signal monitoring circuit monitors a quality parameter of the regulated voltage supply signal and, in response provides an indication of characteristics of the regulated voltage supply signal which bear on a likelihood that continued operation of the voltage regulator circuit is associated with defective circuitry.

In more-specific embodiments, the test control circuitry and the supply-signal monitoring circuit cooperatively stress the voltage regulator circuit during the controlled self-test mode, while using the supply-signal monitoring circuit to test the voltage regulator circuit. The stress can include maximum stress, minimum stress or nominal stress. The test control circuitry causes the logical state circuitry to load the voltage regulator circuit by shifting the data through the logic state circuitry. The logic state circuitry includes logic modules that are scan-chains operated in the controlled self-test mode. More specifically, the logic modules include multiplexers and flip-flops or latches that operate as the scan-chains in the controlled self-test mode. The test control circuitry causes the logic state circuitry to load the voltage regulator circuit by shifting the data through the logic state circuitry in a predefined pattern which causes the load on the voltage regulator circuit. The predefined pattern includes or refers to a circular pattern that results in the original content of the flip-flows or latches (e.g., the data that happens to be in the scan-chains at the time of switching to the controlled self-test mode) being restored at the end of the self-test. The data can shift in a circular manner that includes feedback so that with a number n of data shifts through the logic state circuitry by n shift clock cycles, previous contents of the logic state circuitry are restored. Shifting the data in the circular manner causes the data to shift through and out of the scan-chains and back into the input of the scan-chains so that the data is restored in the logic state circuitry at commencement of the data being shifted during the controlled self-test mode.

The supply-signal monitoring circuit and/or test control circuit monitor a level of integrity of the voltage regulator circuit and power rail of the logic state circuitry and logic modules and can test the voltage regulator circuit by monitoring power-related characteristics. For example, the supply-signal monitoring circuit can include an analog-to-digital converter (ADC), a voltage-level detection circuit, and/or a noise-level sensor used to monitor the quality parameters of the regulated voltage supply. The indication can include notification that the voltage regulator circuit and/or power rail has a failure. The test control circuitry can operate independent of the voltage regulator circuit and of the logic modules of the logic state circuitry such that the test control circuitry continues operating when the voltage regulator circuit fails. In more specific embodiments, the apparatus includes another voltage-source supply signal which supplies operating power to the test control circuitry during the controlled self-test mode and which continues to supply said operating power in the event that the voltage regulator circuit and/or power rail fails.

In various embodiments, the logic modules and the test control circuitry operate during the application mode and the controlled self-test mode. For example, the test control circuitry can control the supply-signal monitoring circuit for indicating whether the supply-signal monitoring circuit operates in the application mode or the controlled self-test mode.

A number of embodiments are directed to methods of using the above described apparatuses to operate a self-test of a voltage regulator circuit. The method can include providing a regulated voltage supply signal as a voltage supply source by a voltage regulator circuit of an apparatus and reconfiguring logic state circuitry including logic modules between an application mode and a controlled self-test mode in which data is shifted through the logic modules in response to a clock signal while being powered from the regulated voltage supply signal. The method further includes causing, during the controlled self-test mode, a predetermined set of the data to shift through the logic modules using a scan mode that causes the logic state circuitry to load the voltage regulator circuit by stressing the voltage regulator circuit. The method further includes monitoring at least one quality parameter of the regulated voltage supply signal and, in response, providing an indication of characteristics of the regulated voltage supply signal which bear on a likelihood that continued operation of the voltage regulator circuit is associated with defective circuitry.

The test results collected during the controlled self-test mode can be stored and compared against other test results and/or thresholds. For example, the results from the controlled self-test mode can be compared with threshold levels corresponding to a likelihood that continued operation of the voltage regulator circuit is associated with defective circuitry. In other embodiments and/or in addition the test results are compared to one or more thresholds.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1A:
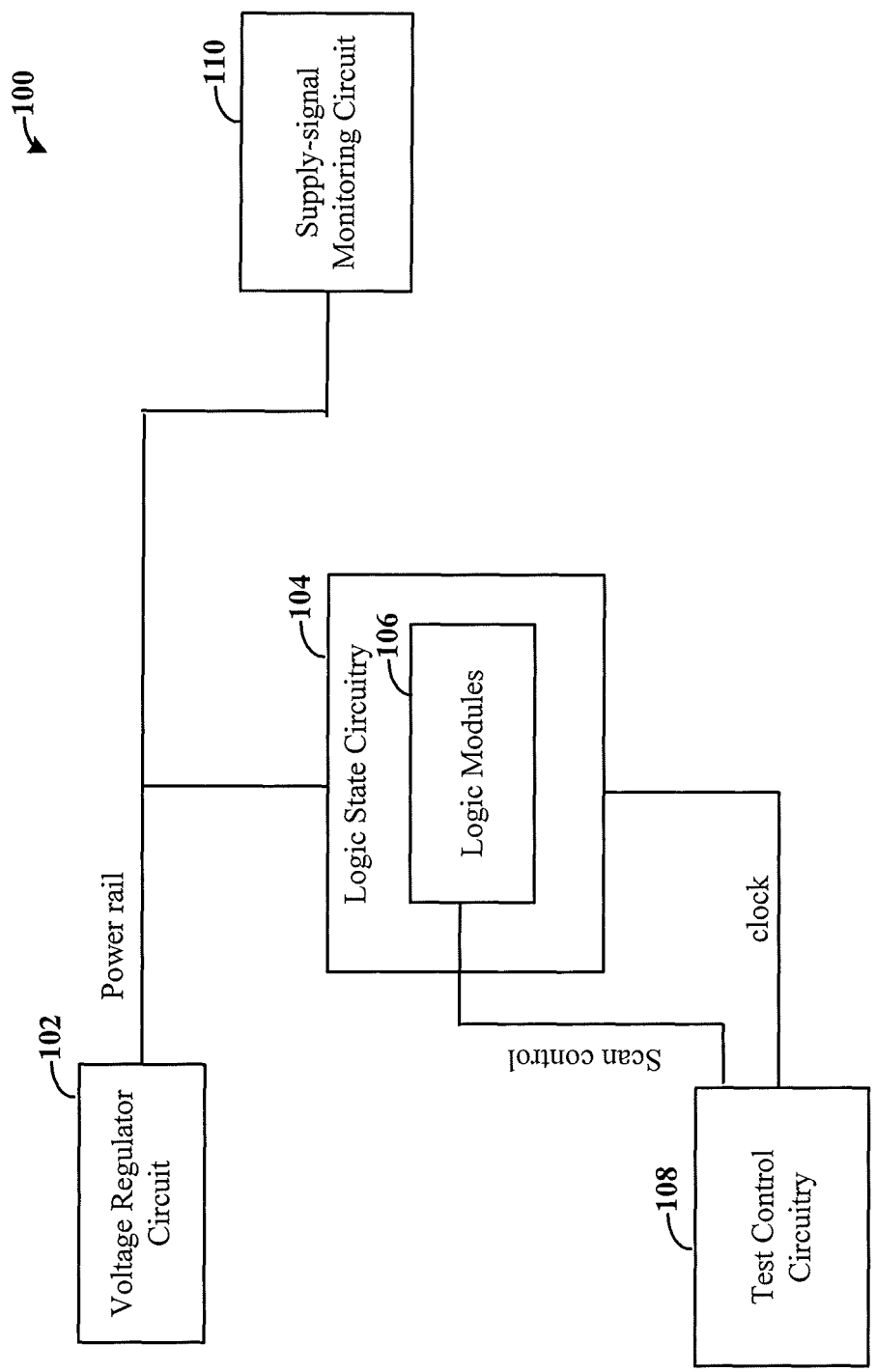
FIGS. 1A-1B illustrate example apparatuses, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving self-testing a voltage regulator circuit. In certain implementations, aspects of the present disclosure have been shown to be beneficial when used in the context of self-testing a voltage regulator circuit, and optionally, a coupled power rail, by causing data to shift through logic modules of application logic. In some embodiments, the predetermined pattern is circular such that the data is shifted through and out of scan-chains and back into the input of the scan-chains and the data is restored in the application logic at commencement of the data being shifted. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Voltage regulator circuits, such as low-dropout voltage regulators (LDOs), can include complex circuits that provide a stable voltage independent of the load current, temperature or voltage variations. For example, an LDO converts an input voltage to a lower supply voltage. For specific applications, voltage regulator circuits operate with particular parameters values, such as varying load currents, load currents that change within a threshold time (e.g., few nanoseconds), output voltage accuracy, maximum overshoot and/or undershoot of the output voltage in response to load changes, and ripple rejection. Testing the quality of the parameter can be beneficial at production and also in the field. Voltage regulator circuits can have a particularly high failure rate as compared to other types of components, as further described herein. Various standards can require or mandate measuring performance parameters in the field. In some specific aspects, it can be beneficial to measure various parameters of the voltage regulator circuit during the lifetime of the apparatus as performance parameters can change over time due to defects and/or aging of circuitry. Embodiments in accordance with the present disclosure include apparatuses and methods for self-testing the voltage regulator circuit using a built-in self-test (BIST), and which can occur periodically during a controlled self-test mode. Specific embodiments include using current drawn by the logic state circuitry in the controlled self-test mode to vary the load by shifting data in a circular manner, sometimes herein referred to as a circular scan. The circular scan varies the load over a current range, which can be an application-near current range. Using an on-chip, supply-signal monitoring circuit, the output of the voltage regulator is monitored. Due to the location of the supply-signal monitoring circuit, that apparatus can be used to additionally monitor the power-rail output. In this manner, the apparatus can self-test the quality of the regulated voltage supply signal and the power rail.

Embodiments in accordance with the present disclosure provide for the self-testing of a voltage regulation circuit and/or power rail without adding additional hardware to the integrated circuit specifically for the purpose of the self-test. For example, embodiments include use of existing test control, logic and supply-signal monitoring circuitry to self-test the voltage regulator circuit and/or power rail. The test load can be formed by the application logic that is configured as a scan shift register during production scan testing, as well as for a controlled self-test performed in the field, and which is set in a proper mode to consume the desired current with the desired dynamic behavior. The test control circuitry (which can be the control unit already forming part of the integrated circuit) can create high switching activity in the combinatorial and sequential application logic, and thus high current consumption. For example, the test control circuitry provides a scan control signal to the application logic, which switches the application logic into the controlled self-test mode. The test control circuitry, during the self-test mode, can shift data in a circular manner through and out of the scan-chains of the application logic, similar to a scan shift-in and shift-out of flip-flop or latch values. While shifting the scan-chains can destroy the original contents of the flip-flops and/or latches, a feedback mechanism can be used to feed the data shifted out of the scan-chain back into the input of the scan-chain. With n flip-flops or latches in each scan-chain, after n shift clock cycles, the original content is restored. Such a data shift is herein referred to as a circular data shift or shifting of the data in a circular manner.

Various embodiments are directed to an apparatus including a voltage regulator circuit, logic state circuitry, test control circuitry, and a supply-signal monitoring circuit. The voltage regulator circuit provides a regulated voltage supply signal as a voltage supply source for a voltage supply rail (e.g., a power rail). The logic state circuitry includes logic modules that are reconfigured between an application mode and a controlled self-test mode. In controlled self-test mode, data is shifted through the logic modules in response to a clock signal while being powered from the regulated voltage supply signal. The test control circuitry operates the controlled self-test mode by causing a predetermined set of the data to shift through the logic modules using a scan mode (e.g., original content is shifted through and back in the logic modules such that the original content is restored via a circular scan mode). The scan mode causes the logic state circuitry to load the voltage regulator circuit by stressing the voltage regulator circuit. The test control circuitry can also provide the clock signal. For example, the predetermined set of the data causes each of the logic modules of the logic state circuitry to be exercised for the controlled self-test mode. The supply-signal monitoring circuit monitors a quality parameter of the regulated voltage supply signal and, in response provides an indication of characteristics of the regulated voltage supply signal which bear on a likelihood that continued operation of the voltage regulator circuit is associated with defective circuitry.

In more-specific embodiments, the test control circuitry and the supply-signal monitoring circuit cooperatively stress the voltage regulator circuit during the controlled self-test mode, while using the supply-signal monitoring circuit to test the voltage regulator circuit. The stress can include maximum stress, minimum stress or nominal stress. For example, the test control circuitry causes the logical state circuitry to load the voltage regulator circuit by shifting the data through the logic state circuitry. The logic state circuitry can include logic modules that are scan-chains which can be configured to be operated in the controlled self-test mode. More specifically, the logic modules include multiplexers and flip-flops or latches that operate as scan-chains in the controlled self-test mode. The test control circuitry causes the logic state circuitry to load the voltage regulator circuit by shifting the data through the logic state circuitry, such as in a predefined pattern (e.g., circular) which causes the load on the voltage regulator circuit. The shift of data can be in the circular manner that includes feedback, as previously described. The data shift in the circular manner causes data to be shifted through and out of the scan-chains and back into the input of the scan-chains so that the data is restored in the logic state circuitry at commencement of the data being shifted.

The supply-signal monitoring circuit and/or test control circuit can monitor a level of integrity of the voltage regulator circuit (and, optionally, the coupled power rail) of the logic state circuitry and logic modules and thereby test the voltage regulator circuit by monitoring power-related characteristics. The integrity of the voltage regulator circuit can be monitored during the controlled self-test mode only (e.g., not during the application mode), such as when the application logic is configured as a scan shift register, as further described herein. The supply-signal monitoring circuit can include an analog-to-digital converter (ADC), a voltage-level detection circuit, and/or a noise-level sensor used to monitor the quality parameter(s) of the regulated voltage supply. The indication can include a notification that the voltage regulator circuit and/or power rail has a failure. The test control circuitry can operate independent of the voltage regulator circuit and the logic modules of the logic state circuitry such that the test control circuitry continues operating when the voltage regulator circuit fails. For example, the apparatus can include another voltage-source supply signal which supplies operating power to the test control circuitry during the controlled self-test mode and which continues to supply said operating power in the event that the voltage regulator circuit and/or power rail fails.

The logic modules and the test control circuitry operate during the application mode and during the controlled self-test mode. The test control circuitry can control the supply-signal monitoring circuit for indicating whether the supply-signal monitoring circuit operates in the application mode or the controlled self-test mode.

In various embodiments, the test results are stored and test results collected during the controlled self-test mode and compared the test results against other test results and/or to the threshold. For example, the results from the controlled self-test mode can be compared with threshold levels corresponding to the likelihood that continued operation of the voltage regulator circuit is associated with defective circuitry.

Figure 1B:
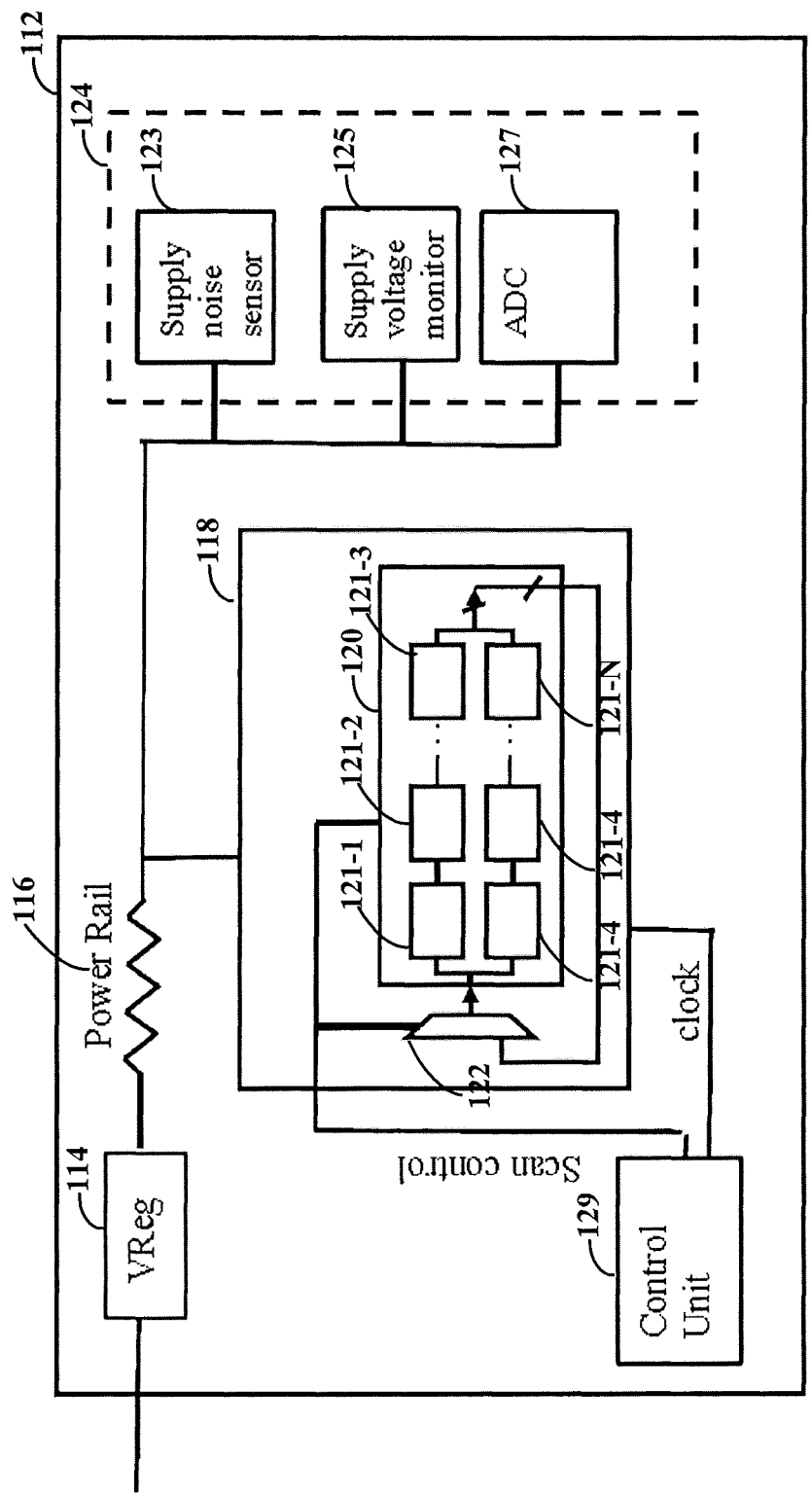

Turning now to the figures, FIGS. 1A-1B illustrate example apparatuses, in accordance with the present disclosure. The apparatuses illustrated herein, such as the apparatuses 100, 112 of FIGS. 1A and 1B, can be used to self-test the respective voltage regulation circuits, and the coupled power rail(s), over varying load conditions and while the apparatuses are in the field.

As previously described, voltage regulator circuits can consume a threshold (e.g., large) amount of power and can be hotter than other components of the integrated circuit. Additionally, voltage regulator circuits can be of a large size, as compared to at least some of the other components, and be more vulnerable to defects. Marginal fails of the voltage regulator circuit can result in the voltage regulator circuit still functioning, but not according to the specification. The marginal failure can lead to supply voltage overshoots (which may cause hick-ups in the digital logic), supply voltage undershoot (which can cause brown-out or trigger a reset in the digital logic), and/or a decrease in analog performance (due to increased noise level at the output voltage). As voltage regulator circuits, such as LDOs, are closed-loop systems, the stability (e.g., phase margin) depends on the load. For various applications, the stability/phase margin can be tested with different load conditions. Additional, in some embodiments, the main voltage regulator circuit transistor is outside the integrated circuit, in order to keep the biggest part of the head dissipation of the voltage regulator circuit outside the integrated circuit. In such example embodiments, the failure rate of the connection from integrated circuit to transistor adds to the failure rate of the transistor itself. Additionally, as further described herein, the power rails can also be self-tested based on the topology of the power rail verses the load.

FIG. 1A illustrates an example apparatus in accordance with present disclosure. As illustrated, the apparatus 100 includes a voltage regulator circuit 102 that provides a regulated voltage supply signal as a voltage supply source for the power rail. The apparatus can self-test the voltage regulator circuit and/or power rail without adding additional hardware to the integrated circuit specifically for the purpose of the self-test by utilizing application logic, e.g., logic modules 106 of the logic state circuitry 104, as a test load.

The logic state circuitry 104 includes a plurality of logic modules 106. The logic state circuitry 104 can be reconfigured between an application mode and a controlled self-test mode. In the controlled self-test mode, a built-in self-test (BIST) of the voltage regulator circuit 102 (and optionally the power rail) is performed by shifting data through the logic modules 106 in response to a clock signal and while being powered by the regulated voltage supply signal from the voltage regulator circuit 102. The voltage regulator circuit 102 provides the regulated voltage supply signal as the supply source for the power rail, which is provided to the logic state circuitry 104. The logic modules 106 are scan-chains that are configurable for operating in the controlled self-test mode. As further illustrated herein, the logic modules 106 can include multiplexers and flip-flops or latches that operate as scan-chains in the controlled self-test mode.

The test control circuitry 108 provides both the scan control signal and the clock signal to the logic state circuitry 104 for operating the application mode and the controlled self-test mode. For example, the test control circuitry 108 operates the controlled self-test mode by causing the predetermined set of data to shift through the logic modules 106 using a scan mode. As described above, the predetermined set of data includes the (original) content of the flip-flops which is given by the state the circuitry is in when switched to self-test mode. The scan mode causes the logic state circuitry 104 to load the voltage regulator circuit 102 by stressing the voltage regulator circuit 102. The scan mode can include a circular scan mode, as previously described. The load can include an extreme load (e.g., maximizing the stress on the voltage regulator circuit 102), a nominal load, and/or a minimum load. The predetermined data set causes each of the logic modules 106 of the logic state circuitry 104 to be exercised for the controlled self-test mode. In specific embodiments, the predetermined set of data is shifted in the circular manner that includes feedback, e.g., the circular scan mode. For example, the data is shifted through and out of the scan-chains and back into the input of the scan-chains so that the data is restored in the logic state circuitry 104 at commencement of the data being shifted during the controlled self-test mode.

As previously described, the data shift can include a predetermined data pattern to be shifted through the logic circuitry, which may cause the logic state circuitry 104 to extremely, nominally, or minimally load. For example, the test control circuitry 108 causes the logic state circuitry 104 to load the voltage regulator circuit 102 by shifting the data in the circular manner that causes the logic state circuitry 104 to load the voltage regulator circuit 102, to be shifted through the logic state circuitry 104. The circular manner of data shifts includes feedback, in specific embodiments, such that logic modules having n flip-flops or latches have n data shifts through the logic state circuitry 104 by n shift clock cycles, and the previous contents of the logic state circuitry 104 are restored.

The supply-signal monitoring circuit 110 monitors at least one quality parameter of the regulated voltage supply signal. In response to the monitoring, the supply-signal monitoring circuit 110 provides an indication of characteristics of the regulated voltage supply signal which bear on the likelihood that continued operation of the voltage regulator circuit 102 is associated with defective circuitry.

The test control circuitry 108 and the supply-signal monitoring circuit 110 can cooperatively provide one or more different types of stress on the voltage regulation circuit 102 during the controlled self-test mode. For example, the data shift can cause the logic state circuitry 104 to extremely load, nominal load or minimally load the voltage regulator circuit 102. While stressing the voltage regulator circuit 102, the supply-signal monitoring circuit is used to test the voltage regulator circuit 102 and/or the power rail.

The test control circuitry 108 and/or the supply-signal monitoring circuit 110 can monitor a level of integrity of the voltage regulation circuit 102 (and the power rail) of the logic state circuitry 104 including the logic modules 106. For example, the supply-signal monitoring circuit 110 can provide an indication of the at least one quality parameter of the regulated voltage supply signal to the test control circuitry 108. The supply-signal monitoring circuit 110 can monitor power-related characteristics of the regulated voltage supply signal to test the voltage regulator circuit 102 and/or power supply. Example power-related characteristics include noise, signal overshoot, signal undershoot, voltage signal settling time, and/or static voltage accuracy at a minimum and/or maximum load current. As further described and illustrated in connection with FIG. 1B, the supply-signal monitoring circuit 110 can include an ADC, a noise-level sensor, and/or a voltage-level detection circuit.

In specific embodiments, the supply-signal monitoring circuit 110 stores test results collected during the controlled self-test mode and compares the test results against other test results and/or thresholds. For example, the supply-signal monitoring circuit 110 can compare the results from the controlled self-test mode with threshold levels corresponding to the likelihood that continue operation of the voltage regulation circuit 102 is associated with defective circuitry.

The test control circuitry 108 can operate independent of the voltage regulator circuit 102 and the logic modules 106 of the logic state circuitry 104. In specific embodiments, the test control circuitry 108 operates when the voltage regulator circuit 102 fails. Additionally, as may be appreciated, the logic modules 106 and test control circuitry 108 operate during the application mode. For example, the test control circuitry 108 can be a control unit that controls the supply-signal monitoring circuit 110 (and the logic state circuitry 104) and indicates whether to operate in the application mode or the controlled self-test mode. In some specific embodiments, the apparatus 100 can include another voltage-source supply signal which supplies operating power to the test control circuitry 108 during the controlled self-test mode and can continue to supply the operating power (such as during an application mode) in the event that the voltage regulator circuit 102 fails.

FIG. 1B illustrates an example apparatus in accordance with various embodiments. The apparatus 112 illustrated by FIG. 1B can include the apparatus 100 of FIG. 1A, with various circuitry illustrated in greater detail. The apparatus 112 includes an integrated circuit having a voltage regulator circuit 114 that provides a regulated voltage supply signal for the power rail 116, logic state circuitry 118, test control circuitry, and a supply-signal monitoring circuit 124, as previously described in connection with FIG. 1A.

As illustrated, the logic state circuitry 118 can include the application logic (e.g., scannable logic 120) which is reconfigured between an application mode and a controlled self-test mode responsive to a scan control signal provided by the test control circuitry. The logic state circuitry 118 includes a plurality of the logic modules 121-1, 121-2, 121-3, 121-4, 121-5, 121-N, and 122 that form scan-chains. The application logic (e.g., scannable logic 120) can be configured as a scan shift register for a production scan test and for self-tests performed in the field to measure voltage regulator circuit performance. The integrity of the voltage regulator circuit 114 (and power rail) can be measured and/or monitored during the controlled self-test mode only (e.g., not during the application mode), when the application logic is configured as the scan shift register. During the application mode, for example, the application logic is not configured as a scan register. The logic modules can include multiplexers 122 and flip-flops or latches 121-1, 121-2, 121-3, 121-4, 121-5, 121-N (herein referred to as flip-flops or latches 121 for ease of reference) that operate as the scan-chains in the controlled self-test mode.

The supply-signal monitoring circuit 124 can include a noise-level sensor 123, voltage-level detection circuit 125, and/or an ADC 127. In a specific embodiments, the ADC 127 provides an indication in a digital form to measure the at least one quality parameter of the regulated voltage supply signal.

The test control circuitry can be part of or include the control unit 129 that is part of the apparatus 112, e.g., the integrated circuit, and is used to set both the clock signal and the scan control signal. The control unit 129 provides the scan control signal and clock signal to the logic state circuitry 118. The scan control signal switches the logic state circuitry 118 (e.g., application logic) into a scan mode, e.g., the circular scan mode. In a specific embodiment, when active, the scan control signal is used to set the scan shift enable signal to 1 for each flip-flop or latch 121 of the scan-chains, route an (external) clock signal to each flip-flop or latch 121 of the scan-chains, set the multiplexers 122 (e.g., the scan-chain circular multiplexers), and deactivates resets of the flip-flops or latches 121.

As illustrated by FIG. 1B, the apparatus 112 can use hardware that is already available on the integrated circuit, that are scan testable, and have supply supervision monitors for function safely. The hardware can have logic added to provide the implementations. For example, a standard scan is inserted for a production scan test to be performed, and a scan-chain feedback multiplexer is implemented. The control unit 129 can include a counter, a clock gating unit, a clock divider, and state machine. The counter counts an integer multiple of circular scan runs. The clock gating unit gates an internal or external clock to the scannable logic. The clock divider provides low-frequency clocks. And, the state machine switches between high and low shift frequency, to start the counter and to stop the BIST run once a complete sequence is executed. The above-described apparatus and methodologies can implement or use an existing mechanism to trigger BIST runs via the control unit 129 and to read out of monitors such that the results are available. The specific implementation can be dependent on the existing infrastructure on the chip.

FIGS. 2A-2D illustrate an example of a circular shift of data exercised for a controlled self-test mode, in accordance with the present disclosure. More specifically, FIGS. 2A-2D illustrate a circular shift of data in the controlled self-test mode by logic modules of a logic state circuitry. The logic state circuitry is application logic 230, such as previously described in connection with FIG. 1B. The application logic 230 illustrated by FIGS. 2A-2D can be part of the apparatuses 100, 112, as illustrated by FIGS. 1A and 1B. As illustrated and further described below, responsive to the application logic 230 being configured from the application mode to the controlled self-test mode (e.g., when the application mode is interrupted in order to run the BIST for measuring the voltage regulator circuit performance), the data in the flip-flops is taken as it is, and is shifted around in the scan-chains using the circular scan mode. The predetermined set of data and/or the predefined data pattern that is used for stressing the voltage regulator circuit is the data/pattern that happens to be in the scan-chains at the time of switching to the controlled self-test mode. The performance of the voltage regulator circuit can be measured only when in the controlled self-test mode and when the application logic 230 is configured as a scan shift register, as previously described.

Figure 2A:
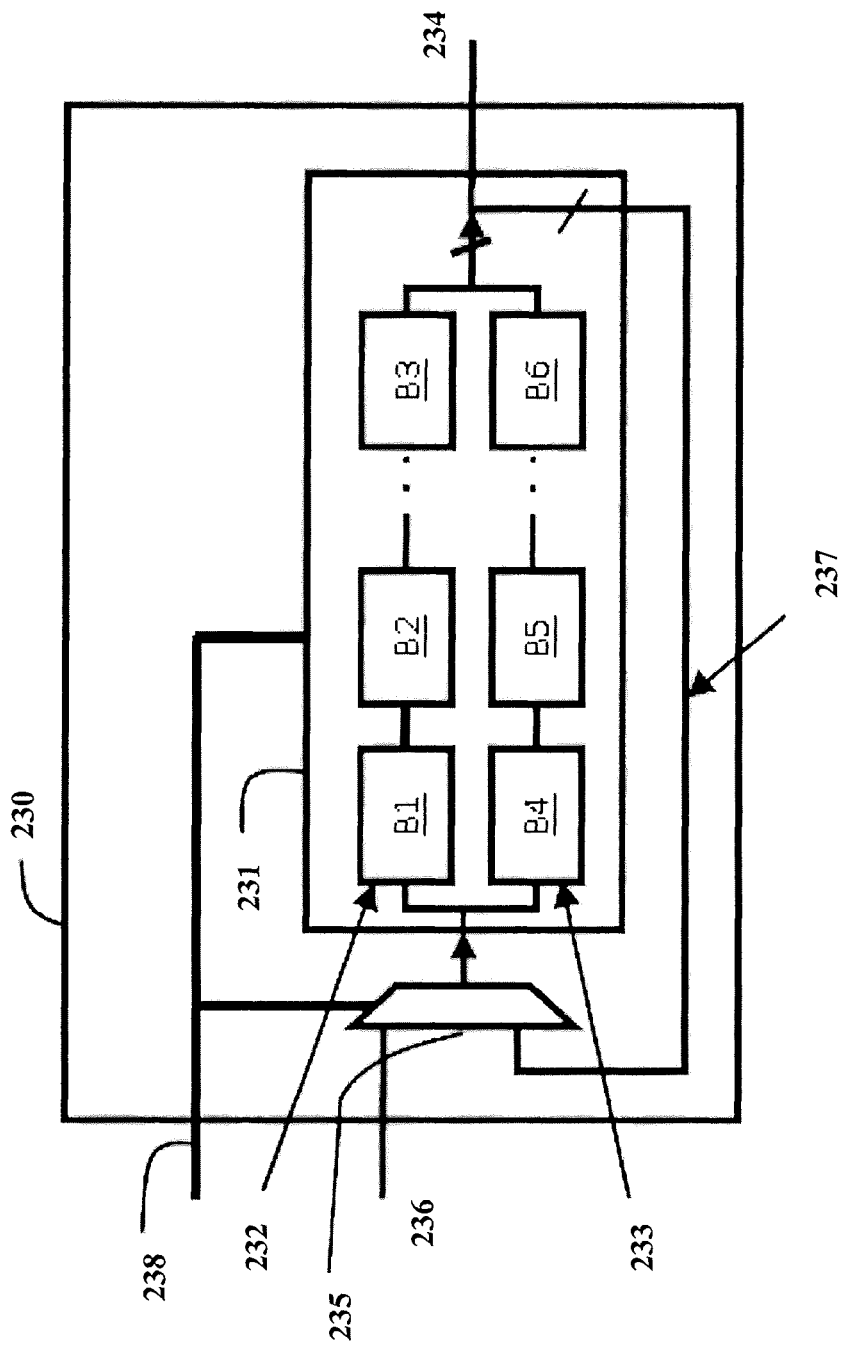
FIGS. 2A-2D illustrate an example of a circular shift of data exercised for a controlled self-test mode, in accordance with the present disclosure.

As illustrated by FIGS. 2A-2D, the example application logic 230 includes two scan-chains and three flip-flops per scan-chain. The application logic 230 with scannable logic includes the scannable logic itself 231, two scan-chains 232 and 233, the scan outputs as used for production scan test 234, the scan multiplexer 235, the scan inputs as used for production scan test 236, the feedback path 237, and the scan control signal 238. FIG. 2A illustrates the original flip-flop contents, which are marked as B1, B2, B3, B4, B5, and B6. Although the embodiment of FIGS. 2A-2D illustrate two scan-chains and three flip-flops per chain, embodiments are not so limited and can include a variety of number of scan-chains, flip-flops or latches.

Figure 2B:
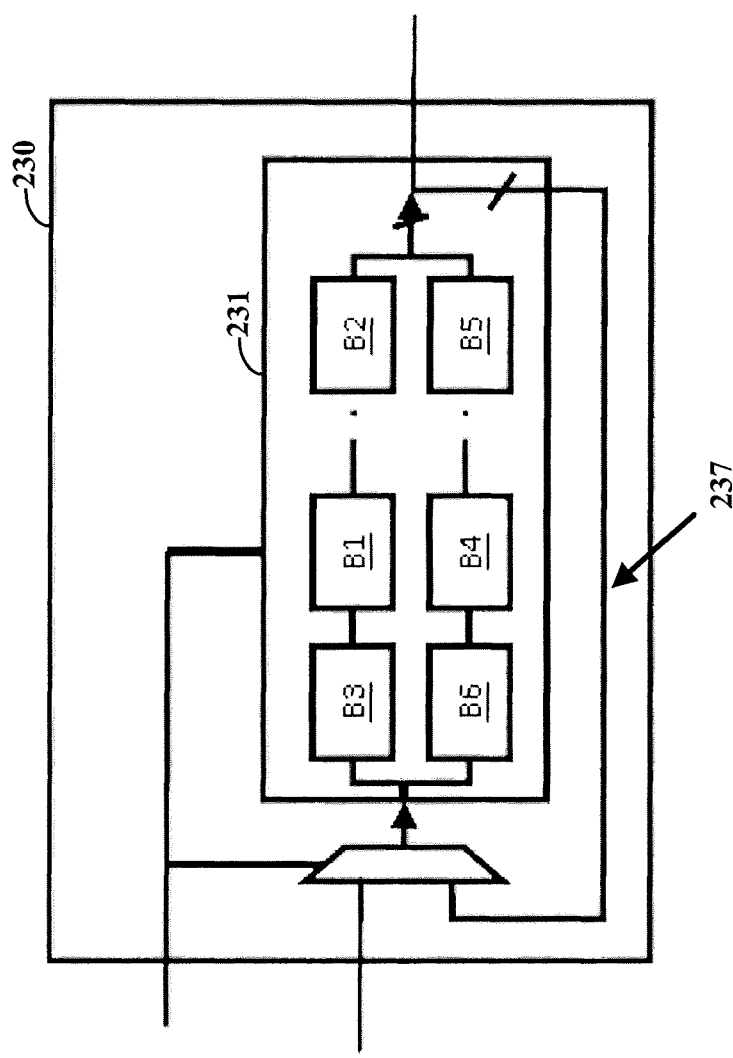
Figure 2C:
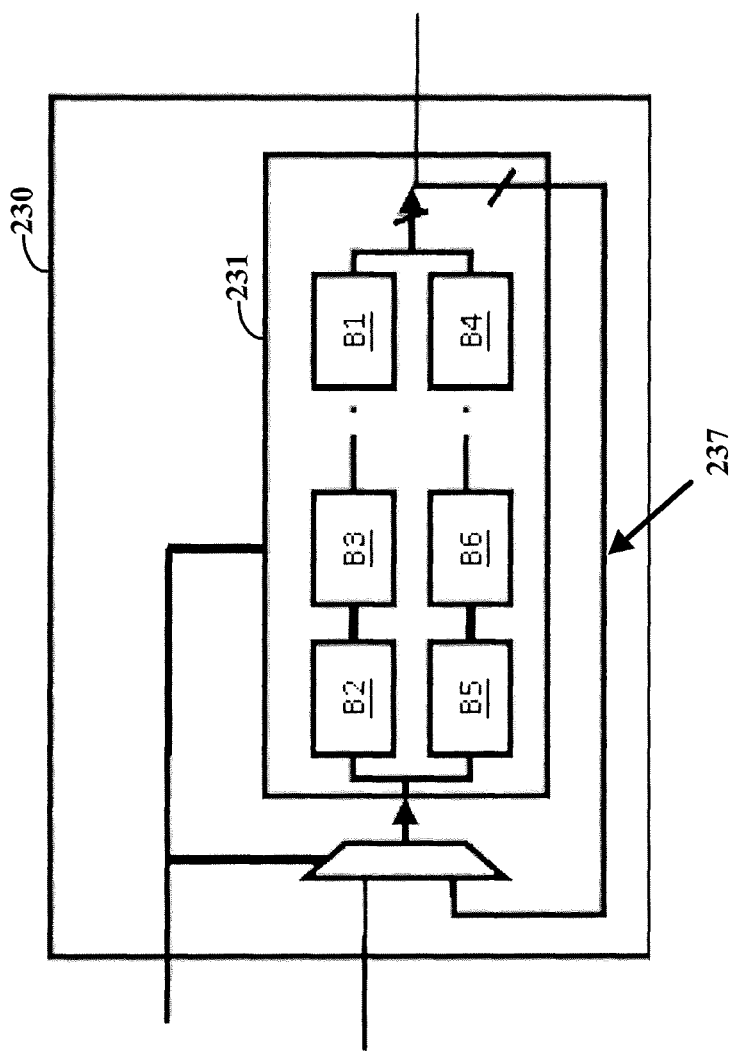
Figure 2D:
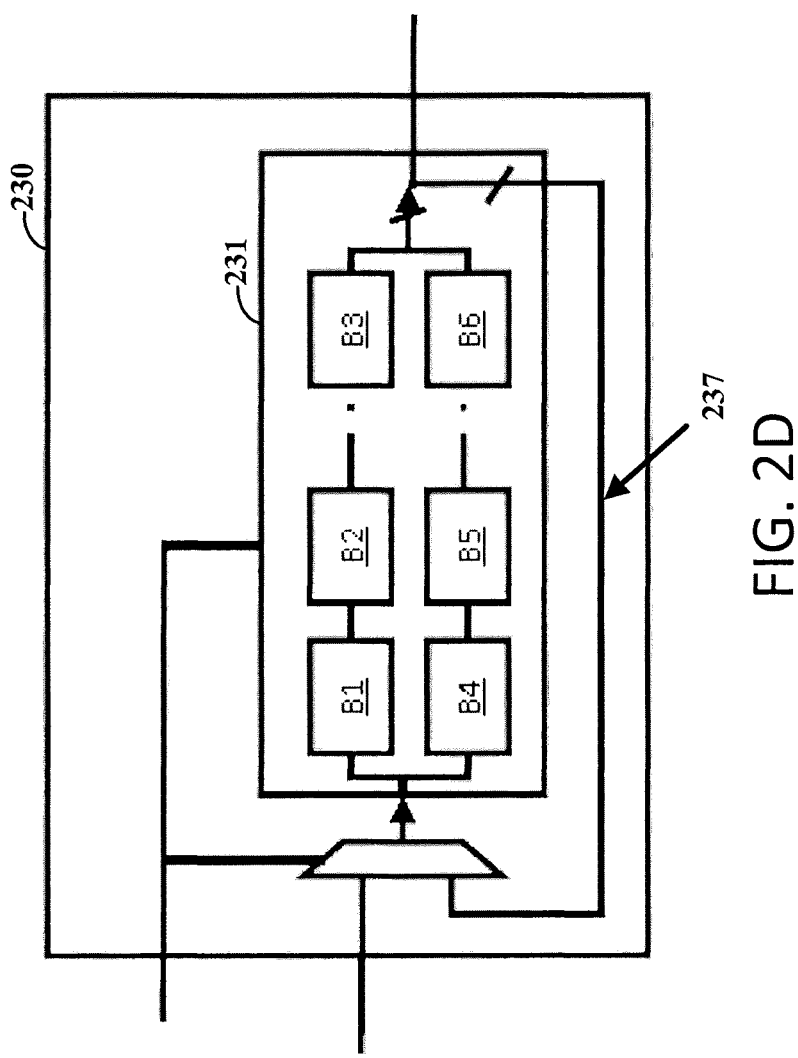

FIGS. 2B-2D illustrate data shifted through the flip-flops in a predetermined data pattern. As illustrated, the predetermined data pattern can include a circular pattern which includes the feedback path 237 used to shift the data back to the original content. FIG. 2B illustrates a first shift cycle in which the previous rightmost values (e.g., B3 and B6 as illustrated by FIG. 2A) are shifted to the beginning of the scan-chains, as illustrated by FIG. 2B. FIG. 2C illustrates a second shift cycle, in which the data is shifted another position to the right (e.g., B3 and B6 are shifted to the middle flip-flops). FIG. 2D illustrates a third shift cycle in which the original contents are restored (e.g., data content of the logic modules in FIG. 2D are the same as in FIG. 2A).

Figure 3:
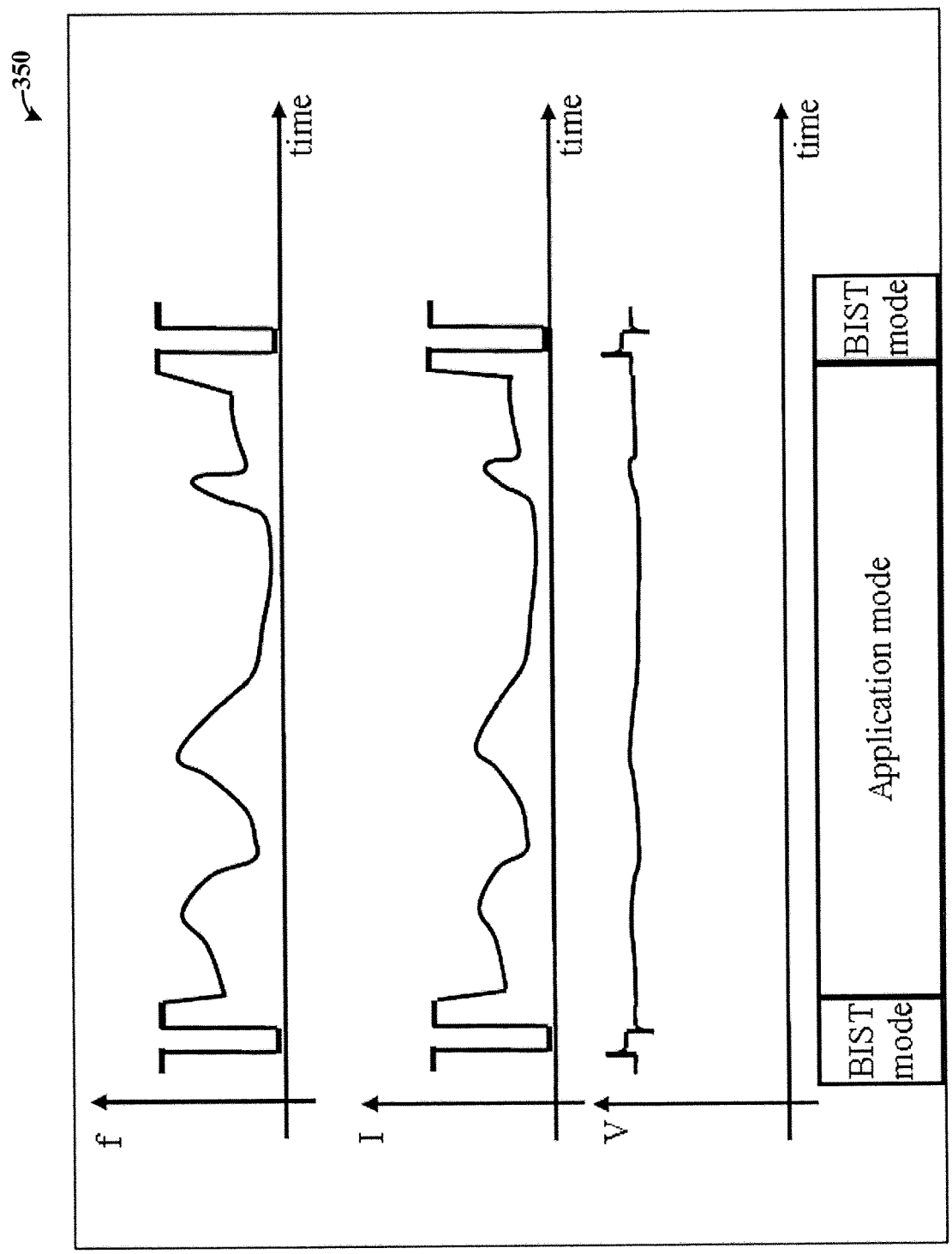
FIG. 3 is a graph illustrating an example of a controlled self-test mode, in accordance with the present disclosure.

FIG. 3 is a graph illustrating an example of a controlled self-test mode, in accordance with the present disclosure. The controlled self-test mode, as previously described, shifts data through the logic modules in a predetermined pattern. In specific embodiments, the predetermined pattern is a circular pattern which includes feedback to restore the original contents of the logic modules. Original content, as may be appreciated, refers to the data content of the flip-flops or latches prior to the controlled self-test.

The graph 350 illustrates example circular scan shift frequency, load current, voltage regulator circuit, e.g., LDO, output voltage for a BIST cycle (with high, low and again high load current), an application mode and another BIST cycle. As illustrated, during the circular scan test, the current consumption is (nearly) proportional to the shift clock frequency—thus, changing this frequency allows changing the load current over a wide range. Additionally, the time axis is not necessarily to scale. The BIST interval may take, for example, 10 us and may be executed every 10 seconds, although embodiments are not so limited. In some specific embodiments, the frequency may be the same as in the circular scan, but as the switching activity (e.g., the percentage of switching nodes, averaged over many cycles) may be much higher in circular scan than in the application mode, the current, referred to as the frequency, the ratio of supply current divided by clock frequency, can be higher. The overshoot and undershoot in the controlled self-test mode can be much higher than in the application mode due to the slope of the load current being steeper in the controlled self-test mode and because the maximum current is higher in the controlled self-test mode.

Figure 4:
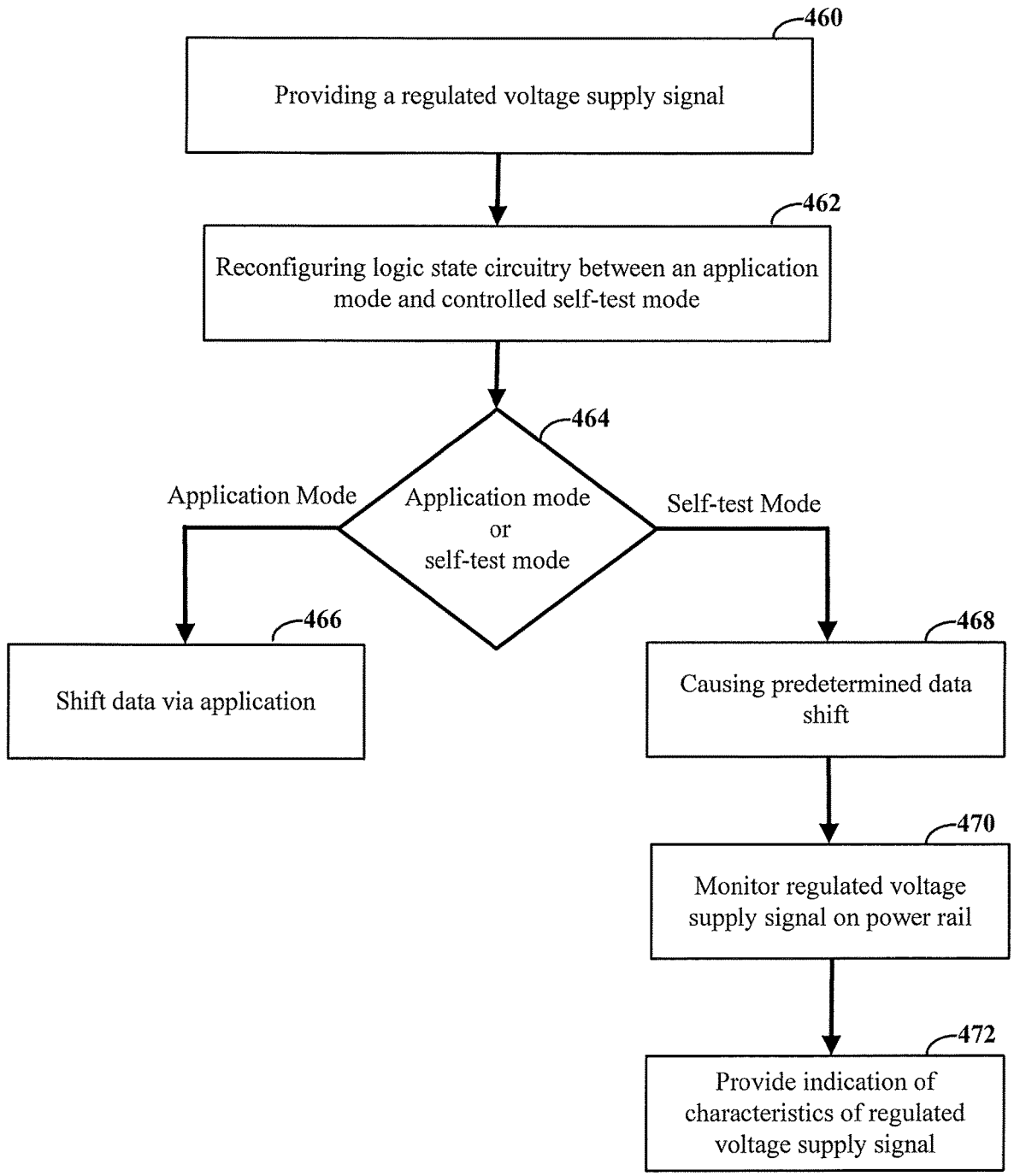
FIG. 4 is a flow chart illustrating an exemplary set of activities and/or data flow for an apparatus of the type implemented in a manner consistent with FIGS. 1A-1B.

FIG. 4 is a flow chart illustrating an exemplary set of activities and/or data flow for an apparatus of the type implemented in a manner consistent with FIGS. 1A-1B. As illustrated, at 460, a regulated voltage supply signal is provided as a voltage supply source by a voltage regulator circuit of an apparatus. At 462, the logic state circuitry including logic modules of the apparatus is reconfigured between an application mode and a controlled self-test mode in which data is shifted through the logic modules in response to a clock signal while being powered from the regulated voltage supply signal. For example, at 464, a determination can be made whether the apparatus is in an application mode or a controlled self-test mode using one or more control signals. In response to the apparatus being in an application mode, at 466, data is shifted using a scan mode related to the application.

In response to determining the apparatus is in a controlled self-test mode, at 468, a predetermined set of the data is shifted through the logic modules (e.g., application logic that is configured at a scan shift register) using a (test) scan mode that causes the logic state circuitry to load the voltage regulator circuit by stressing the voltage regulator circuit. As previously described, the predetermined set of the data causes each of the logic modules of the logic state circuitry to be exercised for the controlled self-test mode. In response to the data shift, at 470, at least one quality parameter of the regulated voltage supply signal is monitored and, at 472, an indication of characteristics of the regulated voltage supply signal which bear on a likelihood that continued operation of the voltage regulator circuit is associated with defective circuitry is provided, as previously described.

Accordingly, apparatuses in accordance with the present disclosure can be used to self-test the voltage regulation circuit and/or power rail(s), and detect marginal failures of either components. Testing a voltage regulator circuit by a BIST mechanism can include use of a test load that draws an adjustable current. To have some headroom between test conditions and required application condition, the minimum current can be sufficiently below the lowest application current, while the maximum current can sufficiently above the highest application current. To test the dynamic behavior of the voltage regulator circuit, the load can change the current it draws with a slope—$\Delta I/\Delta t$—that is higher than in the application.

For the test load, in accordance with embodiments as previously described herein, the load formed by the application logic itself. The application logic is set in a controlled self-test mode so that it consumes the desired current, with the desired behavior. In contrast, additional hardware can be added to the integrated circuit to form artificial loads that are only used for the BIST. While the artificial load provides the advantage of freedom of configuration, it uses additional area of the integrated circuit and design effort.

The power rail can be concurrently tested based on the topology of power rail versus load. A complete fail of the power rail can be visible immediately as the circuitry supplied by the failing power rail branch fail. A marginal fail, such as due to weak vias and which result in a moderately reduced supply voltage in the affected logic modules, resulting in sporadic fails in the digital blocks or reduced performance in the analog blocks can be detected using the above-described controlled self-test mode.

Various safety standards can mandate measuring performance parameters in the field. As a specific example, automotive safety standards, such as ISO 26262, can require a certain Failure In Time (FIT) level. FIT refers to the number of safety-sensitive failures per $10^9$ operating hours that may not exceed a certain limit. Integrated circuit manufacturers may need to provide evidence that circuitry keeps a FIT level, which can be based on process reliability data showing how many defects may occur over a lifetime, and data of the functional safety concept showing how many of these defects are safety-sensitive, and how many of the safety-related defects can be mitigated by functional safety measures. The limit for safety-related defects can be very tight. As examples, it can be 100 FIT for ASIL B and 10 FIT for ASIL D. These rates refer to a complete system, however—each integrated circuit is allowed to have only a fraction of this failure rate. In a typical car radar integrated circuit (IC) or IC chip (qualified for ASIL B; only the silicon considered, not the package), the standards can require as little as 2 FIT.

Moreover, as noted above, integrated circuits sometimes fail during operation in the field—either due to aging mechanisms like NBTI, HCI and TDDB, but also due to latent defects that are activated during the lifetime. Incidents like voltage spikes in a thunderstorm or customer mishandling (e.g. ESD overstress during maintenance or repair) are relevant causes of integrated circuit failures in the field. Often, a partial, i.e., parametric, failure can be more severe than a complete failure. For example, a complete failure can be immediately recognized and counter-acted, while a parametric failure may not. Embodiments in accordance with the present disclosure can allow for testing the parameters of a voltage regulation circuit and/or power rail by a BIST, which can allow for complying with the requirements of standards and identifying failures over the life time of the circuitry.

More specifically, apparatuses in accordance with the present disclosure can be used for production testing, validation as well as for repeated self-test in the field, e.g., for functional checks. The details depend largely on the existing on-chip infrastructure and the requirements. For example, a test against fixed limits can be calculated for parameters such as overshoot and undershoot at load changes at a threshold speed (e.g., fast), and static voltage accuracy at minimum and maximum load current. In other embodiments, no fixed test limits can be used, rather the value of each of the test results can be measured and compared against the respective values of identical voltage regulator circuits in the same integrated circuit. Also, the apparatus can be used to store the determined quality parameter(s) and comparing it against quality parameter(s) determined after accelerated aging tests (e.g., in the course of validation) or after a certain operating time (e.g., during life time in the field) such a self-test can be performed to detect slow changes of parameters.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 120 of FIG. 1B depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 1A and 1B. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described at FIG. 4 is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, the apparatus of FIG. 1A can include the apparatus of FIG. 1B. As another example, the apparatuses illustrated by FIGS. 1A-1B can implement the method illustrated by FIG. 4. Such modifications do not depart from the true spirit and scope of various aspects of the disclosure, including aspects set forth in the claims.

What is claimed is:

1. An apparatus comprising:
   a voltage regulator circuit configured and arranged to provide a regulated voltage supply signal as a voltage supply source;
   logic state circuitry including logic modules configured and arranged to be reconfigured between an application mode and a controlled self-test mode in which data is shifted through the logic modules in response to a clock signal while being powered from the regulated voltage supply signal;
   test control circuitry configured and arranged to operate the controlled self-test mode by causing a predetermined set of the data to shift through the logic modules using a scan mode that causes the logic state circuitry to load the voltage regulator circuit by stressing the voltage regulator circuit, wherein the predetermined set of the data causes each of the logic modules of the logic state circuitry to be exercised for the controlled self-test mode; and
   a supply-signal monitoring circuit configured and arranged to monitor at least one quality parameter of the regulated voltage supply signal and, in response provide an indication of characteristics of the regulated voltage supply signal which bear on a likelihood that continued operation of the voltage regulator circuit is associated with defective circuitry that is utilized in providing the regulated voltage supply signal to the logic state circuitry.

2. The apparatus of claim 1, wherein the test control circuitry and the supply-signal monitoring circuit are cooperatively configured and arranged to maximize stress on the voltage regulator circuit during the controlled self-test mode, while using the supply-signal monitoring circuit to test the voltage regulator circuit.

3. The apparatus of claim 1, wherein the logic modules include multiplexers and flip-flops configurable for operating as scan-chains in the controlled self-test mode, and wherein the test control circuitry is further configured and arranged to cause the logic state circuitry to load the voltage regulator circuit by shifting the data in a circular manner that includes feedback, wherein the data is shifted through and out of the scan-chains and back into an input of the scan-chains so that the data is restored in the logic state circuitry at commencement of the data being shifted during the controlled self-test mode.

4. The apparatus of claim 1, wherein the logic modules are scan-chains configurable for operating in the controlled self-test mode, and wherein the test control circuitry is further configured and arranged to cause the logic state circuitry to extremely load the voltage regulator circuit by shifting the data in a circular manner that includes feedback to so that a number n of data shifts through the logic state circuitry by n shift clock cycles, previous contents of the logic state circuitry are restored.

5. The apparatus of claim 1, wherein the test control circuitry is further configured and arranged to cause the logic state circuitry to load the voltage regulator circuit by causing a predefined data pattern, and which causes the logic state circuitry to extremely load the voltage regulator circuit, to be shifted through the logic state circuitry.

6. The apparatus of claim 1, wherein the voltage regulator circuit includes a low-dropout voltage regulator (LDO).

7. The apparatus of claim 1, wherein the test control circuitry is further configured and arranged to provide the clock signal.

8. The apparatus of claim 1, wherein the test control circuitry is further configured and arranged to operate independent of the voltage regulator circuit and of the logic modules of the logic state circuitry including operating when the voltage regulator circuit fails.

9. The apparatus of claim 1, wherein the test control circuitry is further configured and arranged to monitor a level of integrity of the logic state circuitry including the logic modules.

10. The apparatus of claim 1, wherein the supply-signal monitoring circuit includes an analog-to-digital converter configured and arranged to provide an indication in digital form to measure the at least one quality parameter of the regulated voltage supply signal.

11. The apparatus of claim 1, wherein the supply-signal monitoring circuit includes a noise-level sensor.

12. The apparatus of claim 1, wherein the supply-signal monitoring circuit includes a voltage-level detection circuit.

13. The apparatus of claim 1, wherein the supply-signal monitoring circuit is configured and arranged to test the voltage regulator circuit by monitoring power-related characteristics.

14. The apparatus of claim 1, wherein the logic modules and the test control circuitry are configured and arranged to operate during the application mode, and wherein the test control circuitry is further configured and arranged to control the supply-signal monitoring circuit for indicating whether the supply-signal monitoring circuit operates in the application mode or the controlled self-test mode.

15. The apparatus of claim 1, further including another voltage-source supply signal which supplies operating power to the test control circuitry during the controlled self-test mode and which continues to supply the operating power in the event that the voltage regulator circuit fails.

16. The apparatus of claim 1 wherein the defective circuitry includes circuitry of the voltage regulator circuit.

17. The apparatus of claim 1 wherein the defective circuitry includes a voltage supply rail coupled to the voltage regulator circuit, wherein the logic state circuitry is powered from the regulated voltage supply signal received via the voltage supply rail.

18. A method including
providing a regulated voltage supply signal as a voltage supply source by a voltage regulator circuit of an apparatus;
reconfiguring logic state circuitry including logic modules of the apparatus between an application mode and a controlled self-test mode in which data is shifted through the logic modules in response to a clock signal while being powered from the regulated voltage supply signal;
causing, during the controlled self-test mode, a predetermined set of the data to shift through the logic modules using a scan mode that causes the logic state circuitry to load the voltage regulator circuit by stressing the voltage regulator circuit, wherein the predetermined set of the data causes each of the logic modules of the logic state circuitry to be exercised for the controlled self-test mode; and
monitoring at least one quality parameter of the regulated voltage supply signal and, in response, providing an indication of characteristics of the regulated voltage supply signal which bear on a likelihood that continued operation of the voltage regulator circuit is associated with defective circuitry that is utilized in providing the regulated voltage supply signal to the logic state circuitry.

19. The method of claim 18, further including monitoring at least two of the following power-related characteristics: noise, signal overshoot, signal undershoot, voltage signal settling time, and static voltage accuracy at minimum and/or maximum load current.

20. The method of claim 18, further including storing test results collected during the controlled self-test mode and comparing the test results against other test results.

21. The method of claim 18, further including comparing results from the controlled self-test mode with threshold levels corresponding to the likelihood that continued operation of the voltage regulator circuit is associated with defective circuitry.

22. The method of claim 18, further including causing the logic state circuitry to load the voltage regulator circuit by shifting the data in a circular manner, and by causing a predefined data pattern, which causes the logic state circuitry to extremely load the voltage regulator circuit, to be shifted through the logic state circuitry.

* * * * *